(12) United States Patent
Micielli et al.

(10) Patent No.: US 10,763,880 B1
(45) Date of Patent: Sep. 1, 2020

(54) ANALOG TO DIGITAL CONVERTER

(71) Applicant: NXP USA, INC., Austin, TX (US)

(72) Inventors: Christopher James Micielli, Royal Oak, MI (US); Srikanth Jagannathan, Austin, TX (US); George Rogers Kunnen, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/275,647

(22) Filed: Feb. 14, 2019

(51) Int. Cl.
*H03M 1/36* (2006.01)

(52) U.S. Cl.
CPC .................. *H03M 1/361* (2013.01)

(58) Field of Classification Search
CPC .............................. H03M 1/361; H03M 1/362
USPC .................. 341/155, 156, 159, 161
See application file for complete search history.

(56) References Cited

U.S. PATENT DOCUMENTS

| | | | | |
|---|---|---|---|---|
| 4,417,233 | A * | 11/1983 | Inoue | H03M 1/361 341/156 |
| 4,542,370 | A * | 9/1985 | Yamada | H03M 1/16 327/75 |
| 4,816,831 | A * | 3/1989 | Mizoguchi | H03M 1/146 341/156 |
| 5,070,332 | A | 12/1991 | Kaller et al. | |
| 5,309,157 | A * | 5/1994 | Yee | H03M 1/141 341/119 |
| 7,791,523 | B2 | 9/2010 | Zhuang | |
| 8,952,314 | B2 | 2/2015 | Park et al. | |

FOREIGN PATENT DOCUMENTS

CN 104639169 B 10/2017

OTHER PUBLICATIONS

Dorenberg, J., "A 10-bit 5-Msample / s CMOS Two-Step Flash ADC", IEEE Journal of Solid-State Circuits, vol. 24, No. 2, Apr. 1989.
Zahrai, S., "Review of Analog-to-Digital Conversion Characteristics and Design Considerations for the Creation of Power-Efficient Hybrid Data Converters", Journal of Low Power Electronics and Applications, 2018.
Lin, Y., "A 9-Bit 150-MS/s Subrange ADC Based on SAR Architecture in 90-nm CMOS"; IEEE Transactions on Circuits and Systems-I: Regular Papers, vol. 60, No. 3, Mar. 2013.

(Continued)

*Primary Examiner* — Khai M Nguyen
(74) *Attorney, Agent, or Firm* — David G. Dolezal; Joanna G. Geld

(57) ABSTRACT

An A/D converter includes multiple bin comparators that compare an analog voltage to corresponding bin threshold voltages to provide output signals for providing corresponding comparison results. Some of the comparators includes enable inputs that selectively enable the output signal of the bin comparator to provide the corresponding comparison result based on a corresponding comparison result from at least one other bin comparator. The A/D convertor includes an encoder that utilizes the output signals to provide encoded bit values of the digital output. The A/D converter includes a bin selection circuit that utilizes the output signals to select a voltage level based on the output signals and provides the selected voltage level to a next stage of the A/D convertor. The next stage uses the selected voltage level and the analog voltage to provide at least one lessor bit of the digital output.

20 Claims, 6 Drawing Sheets

(56) References Cited

OTHER PUBLICATIONS

Mitteregger, G., "A 20-mW 640-MHz CMOS Continuous-Time ΣΔ ADC With 20-MHz Signal Bandwitdth, 80-dB Dynamic Range and 12-bit ENOB"; IEEE Journal of Solid-State Circuits, vol. 41, No. 12, Dec. 2006.

* cited by examiner

US 10,763,880 B1

ANALOG TO DIGITAL CONVERTER

BACKGROUND OF THE INVENTION

Field of the Invention

This invention relates in general to Analog-to-Digital (A/D) converters.

Background

A/D converters are used in electronic systems to convert an analog voltage to a digital representation of the analog voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an A/D converter includes multiple bin comparators that compare an analog voltage to corresponding bin threshold voltages to provide output signals for providing corresponding comparison results. Some of the comparators includes enable inputs that selectively enable the output signal of the bin comparator to provide the corresponding comparison result based on a corresponding comparison result from at least one other bin comparator. The A/D convertor includes an encoder that utilizes the output signals to provide encoded bit values of the digital output. The A/D converter includes a bin selection circuit that utilizes the output signals to select a voltage level based on the output signals and provides the selected voltage level to a next stage of the A/D convertor. The next stage uses the selected voltage level and the analog voltage to provide at least one lessor bit of the digital output.

In some embodiments, utilizing such a design may reduce the complexity of the A/D converter (e.g. reduce the number of transistors in the converter). Such a design may also reduce power consumed by the converter in that the comparators that are not needed are powered down.

Figure 1:
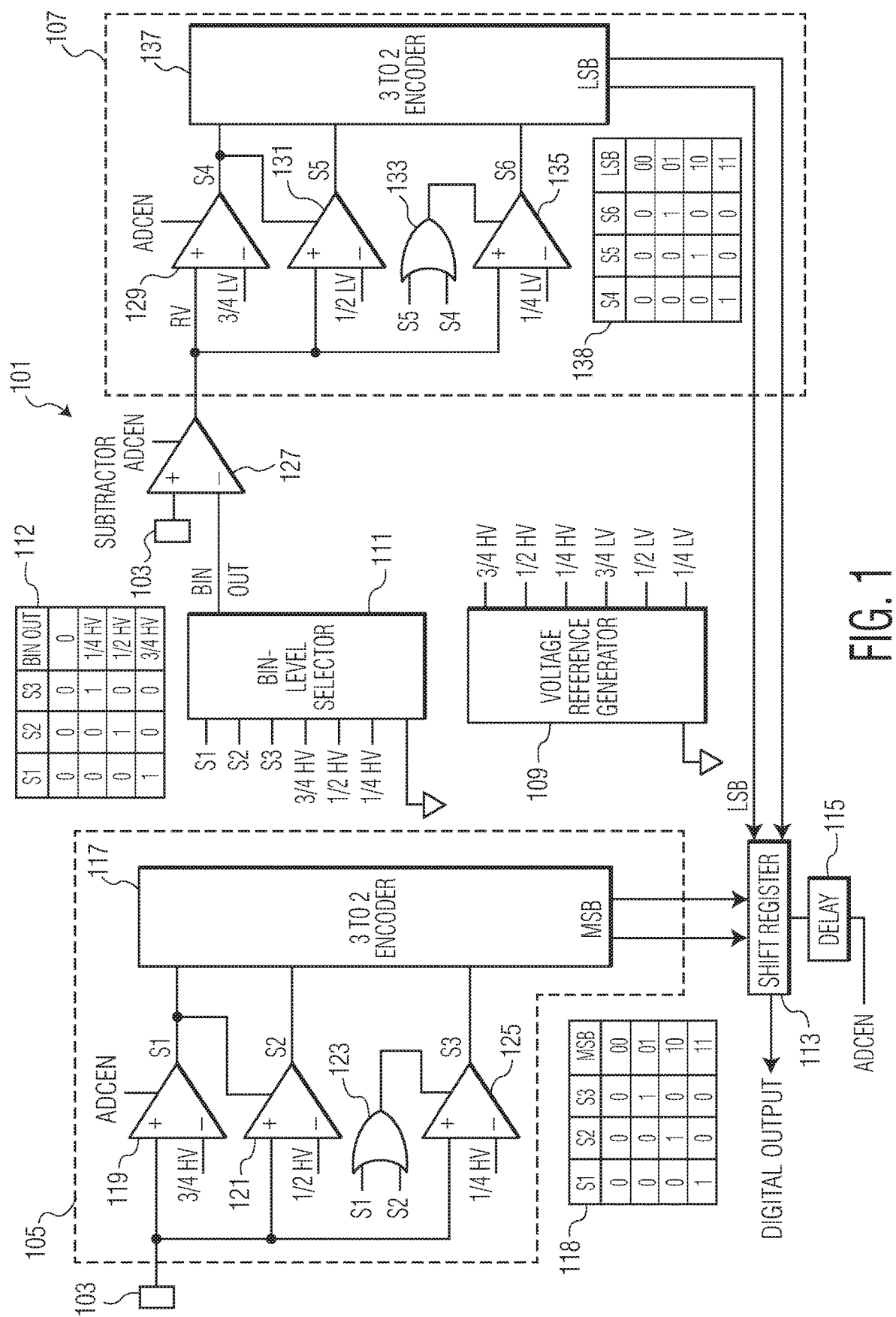
FIG. 1 is a circuit diagram of an A/D converter according to one embodiment of the present invention.

FIG. 1 is a diagram of an A/D converter according to one embodiment of the present invention. A/D converter 101 converts an analog voltage received at input 103 and provides a digital representation (Digital Output) of the analog voltage at the output of shift register 113. In the embodiment shown, the digital output at the output of shift register 113 is a serial output, but in other embodiments, may be a parallel output.

A/D converter 101 includes two stages 105 and 107. In the embodiment shown, stage 105 provides the two most significant bits (MSB) of the digital output and stage 107 provides the two least significant bits (LSB) of the digital output. However, in other embodiments, a stage may provide a greater or lesser number of bits of the digital output.

Stage 105 includes three bin comparators 119, 121, and 125. Each comparator receives at its non-inverting input, the analog voltage from input 103 and compares the analog voltage to a corresponding bin threshold voltage received at its inverting input to determine whether the analog voltage is greater than the threshold voltage. In the embodiment shown, when enabled, a comparator provides a high voltage value ("1") at its output (S1, S2, S3) when the analog voltage is greater than the threshold voltage received at its inverting input and provides a low voltage value ("0") at its output when the analog voltage is less than the threshold voltage. In the embodiment shown, the threshold voltages provided to the inverting inputs of comparators 119, 121, and 125, are ¾ HV, ½ HV, and ¼ HV, respectively, where in one embodiment, HV is the maximum possible voltage of the analog voltage at input 103. In one embodiment, HV is 5 volts, but may be of other values in other embodiments. Also, the number of comparators and threshold voltages may vary with the number of encoded output bits (MSB) provided by the stage. The outputs (S1, S2, S3) of the comparators 119, 121, and 125 are connected to a 3 to 2 binary encoder that converts the information provided by the outputs to a two-bit value based on the comparisons. Table 118 in FIG. 1 shows one embodiment of a truth table for encoder 117.

Each comparator 119, 121, and 125 includes an enable input that is asserted low for enabling the comparator to provide at its output an indication of a comparison of the voltage of input 103 with its corresponding threshold voltage. In the embodiment shown, comparator 119 provides at its output (S1) a high value ("1") and comparators 121 and 125 provides at its output (S2, S3) a low value ("0") when the enable signal is at a non-asserted high value ("1"). The enable input of comparator 119 receives a global enable signal (ADCEN) that is asserted low to enable converter 101 to convert the analog voltage at input 103. When the (ADCEN) signal is at a non-asserted high value, S1 is 1. When the ADCEN is an asserted low value, S1 is high when the analog voltage at input 103 is above ¾ HV and is 0 when the analog voltage is below ¾ HV.

The enable input of comparator 121 is connected to the output S1 of comparator 119. When S1 is high ("1"), comparator 121 is not enabled to provide a comparison and provides a low value ("0") at its output (S2). When S1 is low ("0"), comparator 121 provides a comparison at its output S2. If the voltage of input 103 is higher than ½ HV, then S2 is a high value ("1"). If the voltage of input 103 is lower than ½ HV, then S2 is a low value ("0").

The enable input of comparator 125 is connected to the output of OR gate 123. The inputs of OR gate 123 are connected to S1 and S2. When either of S1 or S2 is high ("1"), comparator 121 is not enabled to provide a comparison and provides a low value ("0") at its output (S3). When both S1 and S2 are low ("0"), comparator 125 provides at its output S3 a comparison of the voltage at input 103 to ¼ HV. If the voltage of input 103 is higher than ¼ HV, then S3 is a high value ("1"). If the voltage of input 103 is lower than ¼ HV, then S3 is a low value ("0").

In operation when A/D converter 101 is enabled, if a "higher threshold voltage" comparator of 119, 121, and 125 determines that the voltage of 103 is above the threshold voltage at its inverting input, then its output (S1, S2) will disable the lower threshold voltage comparators to where those outputs will provide a low voltage (0). For example, if S1 is a high voltage ("1"), comparators 121 and 125 will be disabled and provide a low voltage ("0"). If comparator 119 provides a low voltage and comparator 121 provides a high voltage (indicating that the voltage of 103 is between ¾ HV and ½ HV, comparator 125 will be disabled to provide a low voltage value.

Accordingly, by disabling lower threshold voltage comparators with the outputs of the higher threshold voltage comparators, only one of signals S1, S2, and S3 will be at a high value. With some embodiments of the disclosed configuration, the binary encoder 117 may be of a simpler design. On the other hand, if lower threshold voltage comparators were not disabled by the outputs of higher threshold voltage comparators, then multiple comparators would return high values if the voltage of input 103 is above ½ HV. With such prior art circuits, more complex encoders such as a thermometer to binary encoder or additional logic gates may have to be used. Such complex encoders or additional logic gates would increase the number of transistors used in the converter thereby increasing the overall power consumption of the system.

Outputs S1, S2, and S3 are provided to a bin level selector 111 that uses the outputs to provide a voltage (BIN OUT) to the inverting input of subtractor 127 that is representative of a highest threshold voltage (0 V, ¼ HV, ½ HV, ¾ HV) that the voltage of input 103 is greater than. Table 112 show the voltages provided by the bin level selector 111 based on the received outputs S1, S2, and S3. BIN OUT also provides a ground voltage when input 103 is at a voltage below ¼ HV. Subtractor 127 also includes an enabling input that receives the ADCEN signal which is asserted low to enable subtractor 127. Subtractor subtracts the BINOUT voltage from the voltage of input 103 to provide a remainder voltage (RV) to stage 107. In the embodiment shown, the maximum value of the remainder voltage is ¼ HV. However, the maximum value may be of other values in other embodiments.

Stage 107 uses the remainder voltage (RV) to determine the two least significant bits (LSB) of the digital output. In the embodiment shown, stage 107 is configured similarly to stage 105 except that comparators 129, 131, and 135 compare the remainder voltage RV to fractions of a lower voltage (LV) to provide signals at their outputs (S4, S5, and S6), wherein LV is equal to ¼ HV. As with stage 105, the output of the higher threshold voltage comparators enables the lower threshold voltage comparators such that at most, only one of S4, S5, and S6 will be at a high voltage. The output of OR gate 133 is provided to the enable input of comparator 135. Table 138 shows the truth table for the 3 to 2 encoder 137 that provides the binary encoded LSB. Comparator 129 and subtractor 127 are enabled by the asserted low ADCEN signal.

In the embodiment shown, the threshold voltages ¾ HV, ½ HV, ¼ HV, ¾ LV, ½ LV, and ¼ LV are provided by voltage reference generator 109.

In the embodiment shown, the MSB and LSB bits are provided to shift register 113 in a parallel configuration. Shift register 113 provides the data in a serial configuration. Converter 101 includes a delay circuit 115 for delaying the assertion of the ADCEN signal to shift register 113 in providing the digital output. In some embodiments, the delay in providing the digital output is utilized to allow for the propagation of the correct digital output through stages 105 and 107. Because stage 105 relies upon the output of the higher threshold voltage comparators (e.g. S1) to disable the lower threshold voltage comparators such that only a maximum of one of S1, S2, and S3 is a 1, the initial outputs of the lower threshold voltage comparators (e.g. S3) may be incorrect until comparator 119 is enabled for comparison. Furthermore, stage 107 cannot provide a correct LSB until bin level selector 111 provides the correct BIN OUT voltage and outputs S4, S5, and S6 provide the correct values. Thus, the delay value may depend on the speed of the circuitry of stages 105 and 107 and bin level selector 111, the number of comparators per stage, and the number of stages of A/D converter 101. In one embodiment, the delay is 1 μs, but may be of other values in other embodiments.

Figure 2:
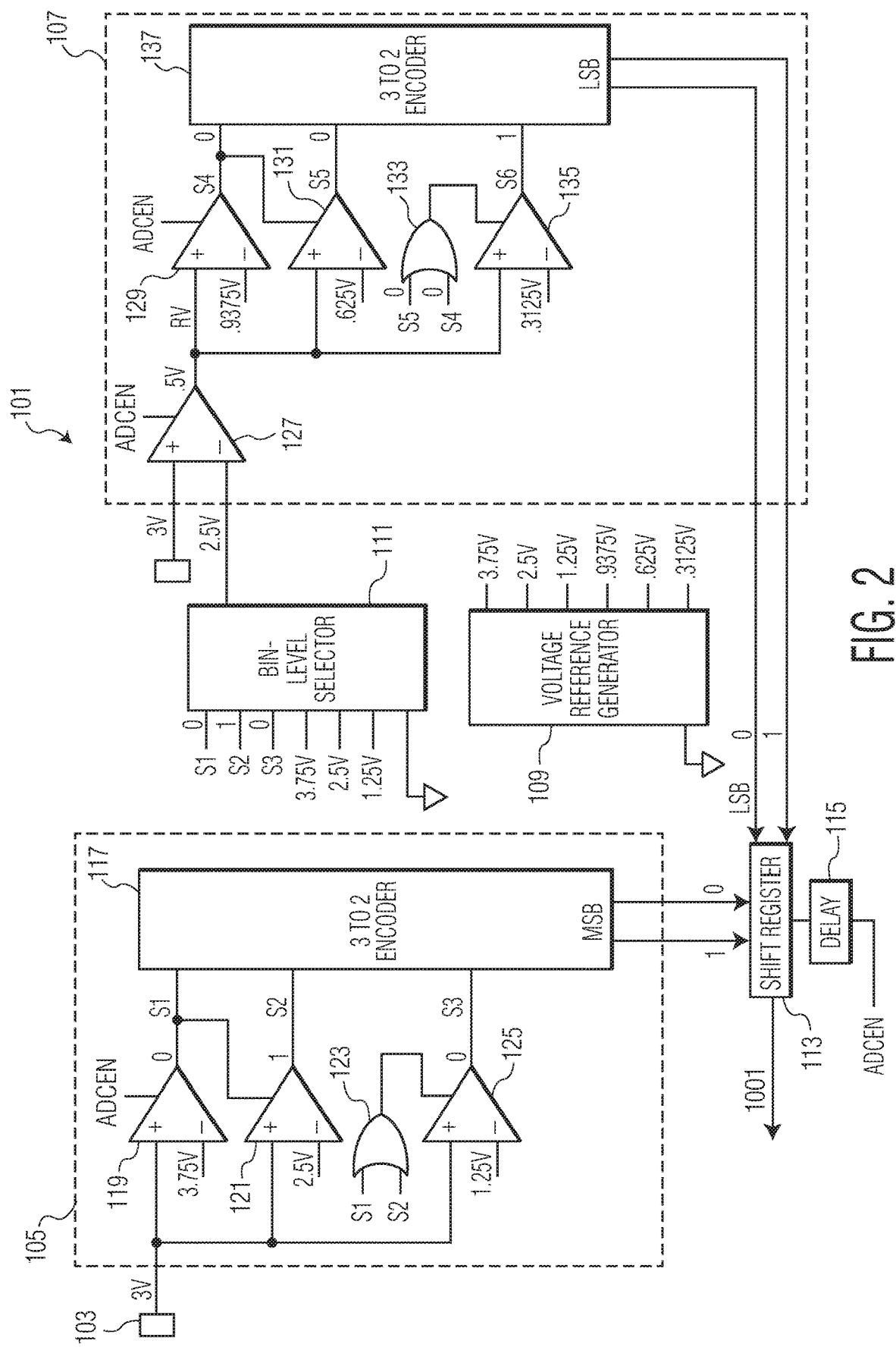
FIG. 2 is a circuit diagram of an A/D converter of FIG. 1 showing signal values for one example of the generation of a digital representation from an analog voltage according to one embodiment of the present invention.

FIG. 2 shows a specific example of converter 101 providing a digital representation of an analog voltage at input 103. In the embodiment of FIG. 2, the analog voltage of input 103 is 3 volts. The maximum voltage that input 103 could be is 5 volts, which is the value of HV. According, ¾ HV is 3.75V, ½ HV is 2.5 V, and ¼ HV is 1.25V, which are provided to the inverting inputs of comparators 119, 121, and 125 respectively.

Because the voltage of input 103 is 3 volts, comparator 119 provides a "0" at S1 which enables comparator 121. Because the voltage of input 103 (3 volts) is greater than 2.5V, comparator 121 provides a 1 value at S2 which disables (through OR gate 123) comparator 125 causing S3 to be 0. Referring back to table 118 of FIG. 1, S1, S2, and S3 providing a value of 010 causes encoder 117 to generate a 10 as the most significant bits. Referring to table 112 of FIGS. 1, S1, S2, and S3 providing a value of 010 causes bin level selector to provide 2.5 V as the BIN OUT voltage.

Referring back to FIG. 2, subtractor 127 subtracts the 2.5V BIN OUT voltage from the 3 Volts at input 103 voltage to provide 0.5 Volts as a remainder voltage RV. Since 0.5 V is less than 0.9375V (which is ¾*¼*5V), comparator 129 provides a 0 for S4 which enables comparator 131. Because 0.5 V is less than 0.625V (which is ½*¼*5V), comparator 131 provides a 0 at S5 and comparator 135 is enabled (through OR gate 133). Because 0.5 Volts is greater than 0.3125 V (which is ¼*¼*5 V), comparator 135 provides a 1 as S6. Referring to table 138 of FIG. 1, a value of 001 for S4, S5, and S6 means that encoder provides 01 as the LSB bits.

Referring back to FIG. 2, after the delay provided to the ADCEN signal by delay circuit 115, shift register 113 provides at its output the value of 1001 as a digital representation of 3 volts at input 103.

Figure 3:
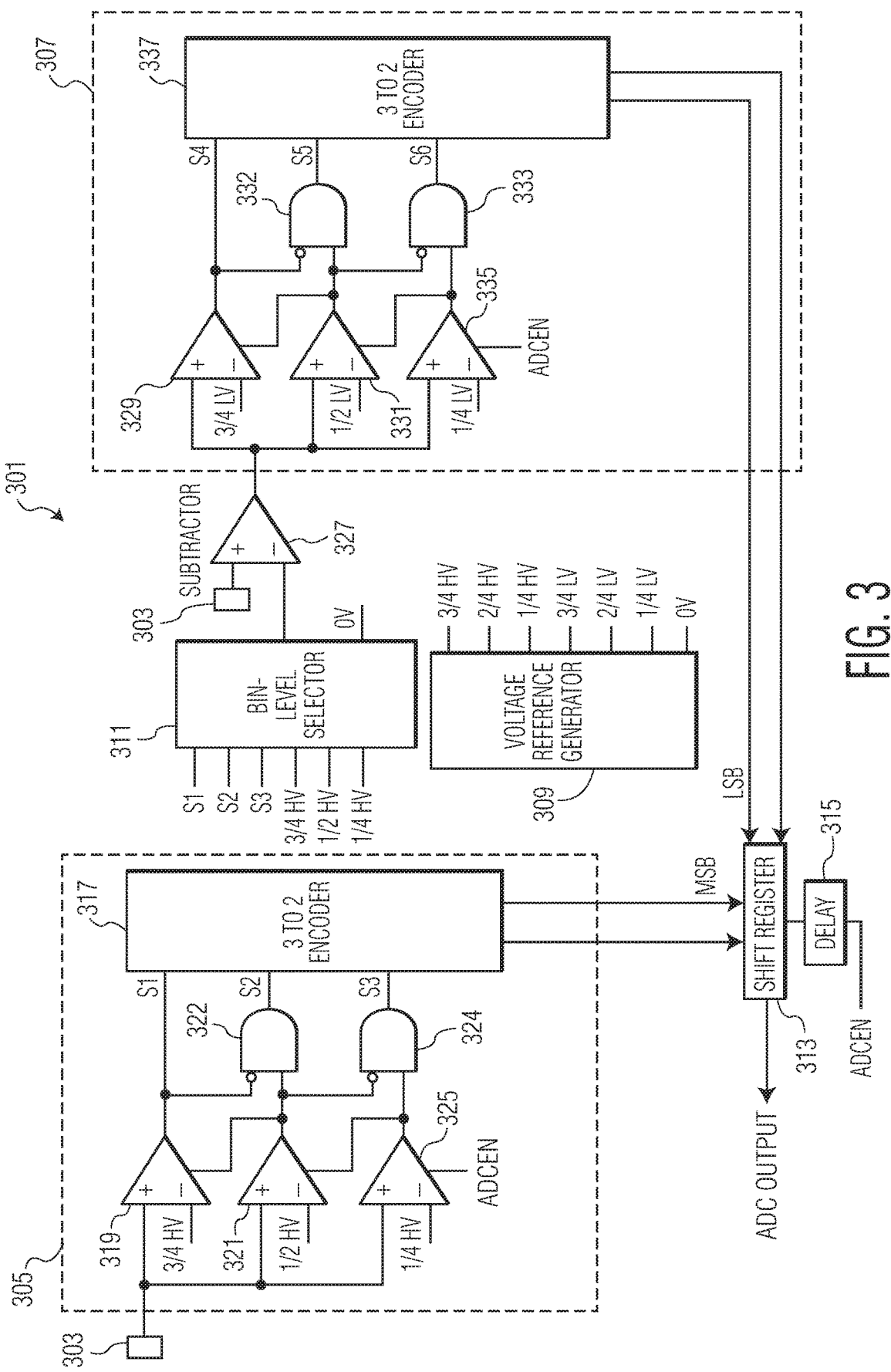
FIG. 3 is a circuit diagram of an A/D converter according to another embodiment of the present invention.

FIG. 3 is a circuit diagram of another embodiment of an A/D converter according to another embodiment of the present invention. A/D converter 301 includes an input 303, a first stage 305 that produces the 2 most significant bits (MSB), and a second stage 307 that produces the 2 least significant bits (LSB). Converter 301 includes a bin level selector 311, a voltage reference generator 309, a subtractor 327, shift register 313, and delay circuit 315 which are similar to bin level selector 111, voltage reference generator 109, subtractor 127, shift register 113, and delay circuit 115 of converter 101, respectively. Also, encoder 317 of stage 305 and encoder 337 of stage 307 are similar to encoders 117 and 137 respectively.

Converter 301 differs from converter 101 in the generation of signals S2, S3, S5, and S6 from the bin comparator outputs by implementing additional encoding logic AND gates 322 and 324. With converter 301, S2 is produced by AND gate 332 ANDing the inverted output of comparator 319 and the output of comparator 321. If comparator 319 indicates that the voltage of input 303 is higher than ¾ HV, then the output of S2 will be a 0. At such a condition, S3 will also be a 0 in that comparator 321 provides a 1 because the output of comparator 321 will indicate that the voltage of input 303 will be greater than ½ HV.

If the voltage of input 303 is less than ¾ HV but greater than ½ HV, S1 will be a 0 and S2 will take the value of the output of comparator 321, which is a 1. S3 will be a 0 because the 1 produced by comparator 321 will cause S3 to be a 0 even though the output of comparator 325 is initially a 1.

If the voltage of input 303 is less than ½ HV but greater than ¼ HV, S1 and S2 will be a 0 and S3 will be the value of the output of comparator 325, which is a 1. S1, S2, and S3 will be 0 when the voltage of input 303 is less than ¼ HV.

In the embodiment of FIG. 3, comparator 325 includes an input to receive a global enable signal (ADCEN), that when is a 1 value, enables comparator 325. For converter 301 of FIG. 3, the enable signal is asserted high. When the enable signal is low (0), comparator 325 will also produce a 0. The output of comparator 325 is connected to the enable input of comparator 321 and comparator 321 is enabled if the output of comparator 325 is a 1. The output of comparator 321 is connected the enable input of comparator 319 and comparator 319 is enabled if the output of comparator 321 is a 1. In this way, a higher threshold voltage comparator (e.g. 319) is disabled if a lower threshold voltage comparator does not indicate that the voltage of input 303 is greater than its threshold voltage. For example, if the voltage of input 303 is less than ¼ HV, then comparator 325 output will disable comparator 321 (causing it to produce a 0 at its output) which will disable comparator 319 (causing it to produce a 0 at its output). In some embodiments, encoder 317 may have a different configuration where it incorporates the function of AND gates 322 and 324. Comparators 329, 331, and 335 and AND gates 332 and 333 work in a similar way in producing signals S4, S5, and S6.

One advantage of the configuration of FIG. 3 where the lower threshold voltage comparators disable the higher threshold voltage comparators from providing a comparison result, is that higher threshold voltage comparators may be, in some embodiments, turned off if the lower threshold voltage comparators indicate that the voltage of input voltage is less than the lower threshold voltage comparator's threshold voltage. In such a case, there will be no need for the higher threshold voltage comparators to operate. Accordingly, such a configuration, may lead to a reduction in power consumption.

Figure 4:
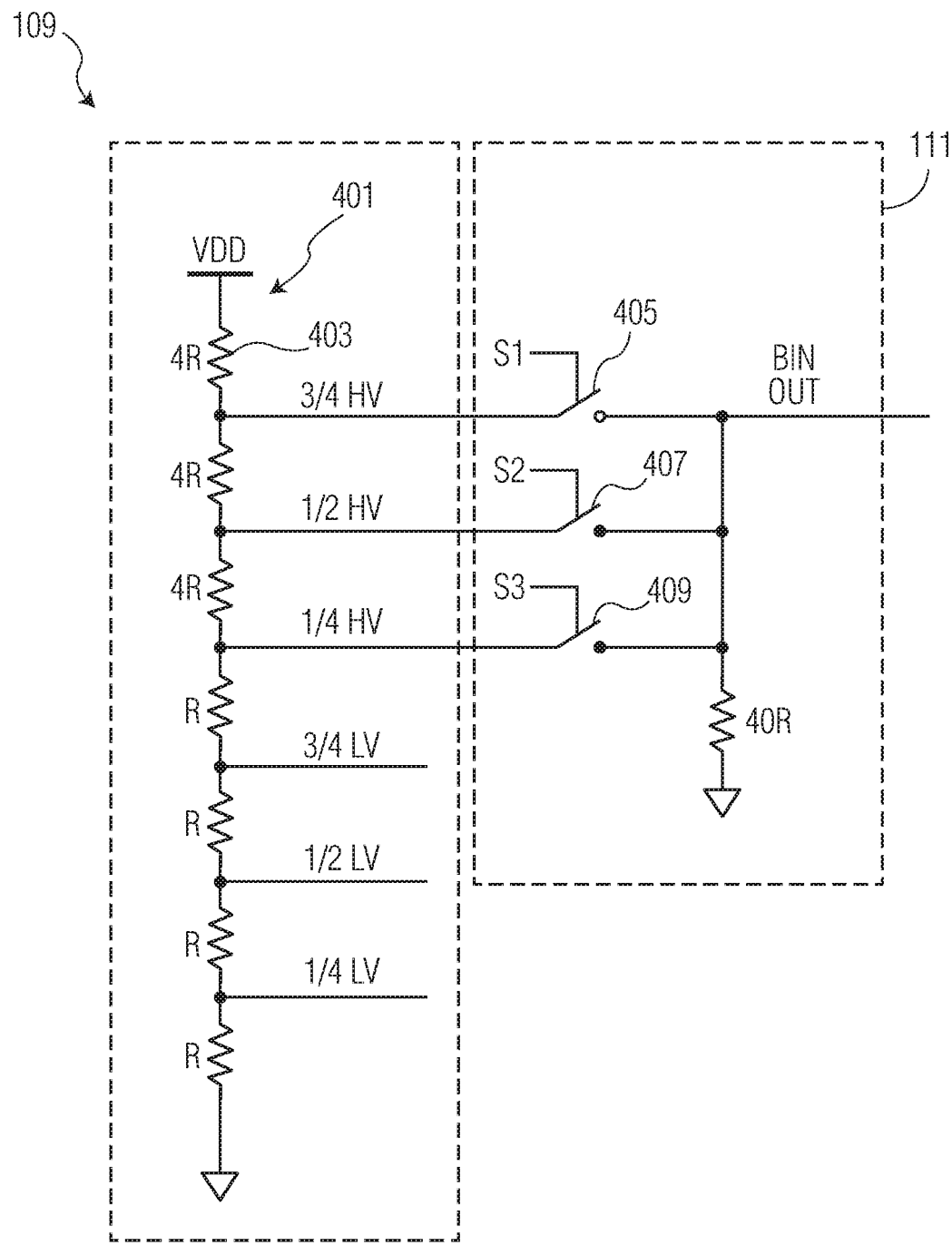
FIG. 4 is a circuit diagram of a voltage reference generator and bin selector according to one embodiment of the present invention.

FIG. 4 is a circuit diagram of a bin selector and voltage reference generator according to one embodiment of the present invention. In the embodiment shown, reference generator 109 is implemented with a resistor ladder 401 that includes a number of resistors (e.g. 403) having a resistance value of R or 4 times R (4R). Nodes of ladder 401 provide the ¾ HV, the ½ HV, the ¼ HV, the ¾ LV, the ½ LV, and the ¼ LV threshold voltages. A resistive value of 4R is located between the nodes providing the fractional HV voltage values and a resistive value of R is located between the nodes providing the fractional LV voltage values. In one embodiment, the resistance R is 10K ohms, but may be of other values in other embodiments.

In FIG. 4, the S1, S2, and S3 signals are directly provided to the bin level selector 111. In the embodiment shown, selector 111 uses the S1, S2, and S3 signals to control switches 405, 407, and 409 to couple one of the nodes of resistor ladder 401 to the output (BIN OUT) of selector 111. In the embodiment shown, the S1, S2, and S3 signals being at a 1 value closes the corresponding switch of switches 405, 407, and 409. If all of the S1, S2, and S3 signals are zero, the output of selector 111 is coupled to ground by a resistor having a large resistance value (e.g. 40 R) to provide a ground voltage. In one embodiment, switches 405, 407, and 409 are implemented with MOSFETS, but maybe implemented with other types of transistors in other embodiments (e.g. pass gates).

In one embodiment, providing a stage of an A/D converter where the output of some bin comparators disable other bin comparators so that a maximum of only one bin comparator provides a 1 allows for a simplified bin level selector, in that the comparator outputs can be used to selectively provide the threshold voltage for the next stage.

Figure 5:
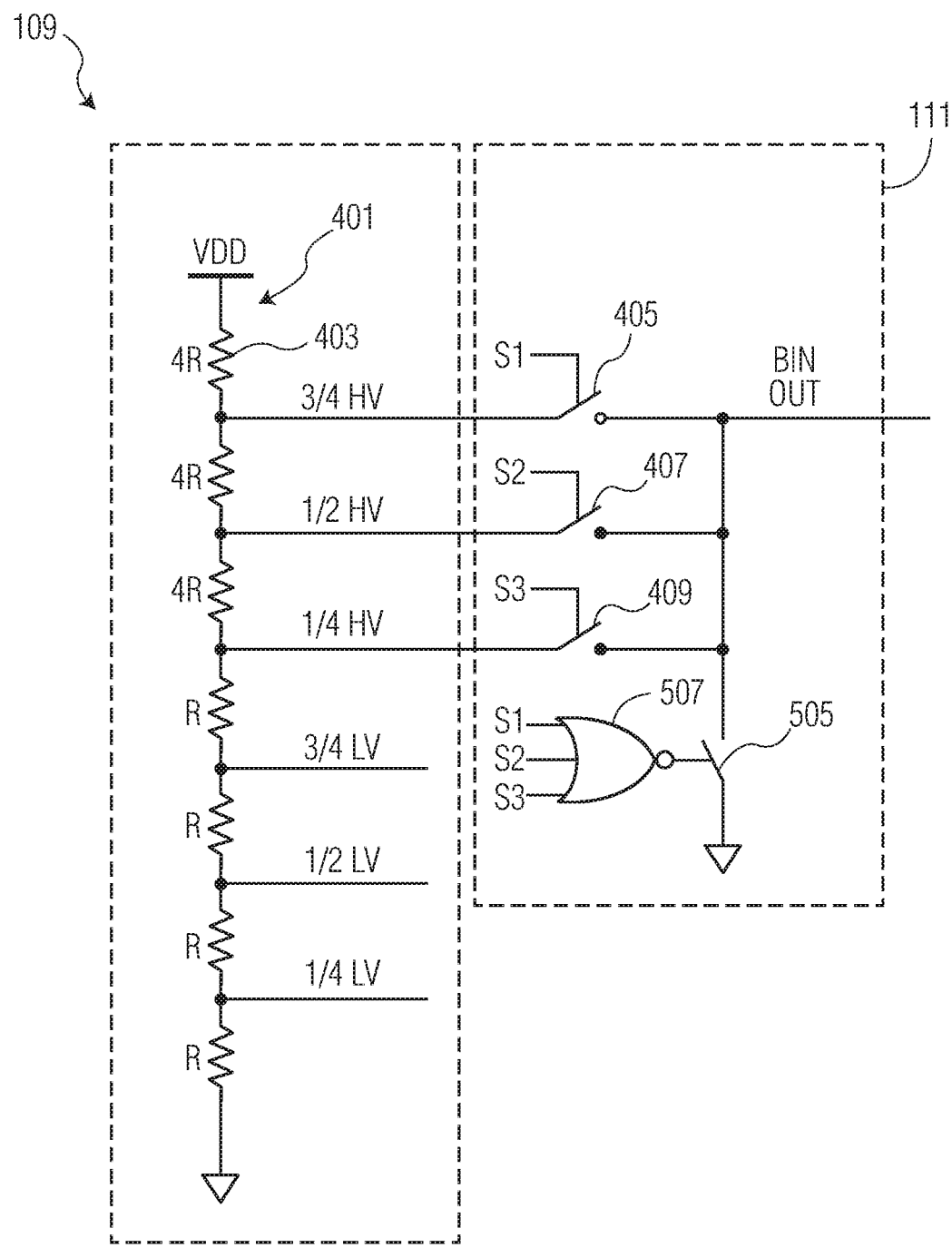
FIG. 5 is a circuit diagram of a voltage reference generator and bin selector according to another embodiment of the present invention.

FIG. 5 is a circuit diagram of another embodiment of voltage reference generator 109 and bin level selector 111. In the embodiment of FIG. 5, selector 111 includes a switch 505 that is used to connect the output of selector 111 to ground if S1, S2, and S3 are all zero (indicating that the reference voltage should be ground). NOR gate 507 receives the S1, S2, and S3 signals and provides a 1 if all three are 0.

Figure 6:
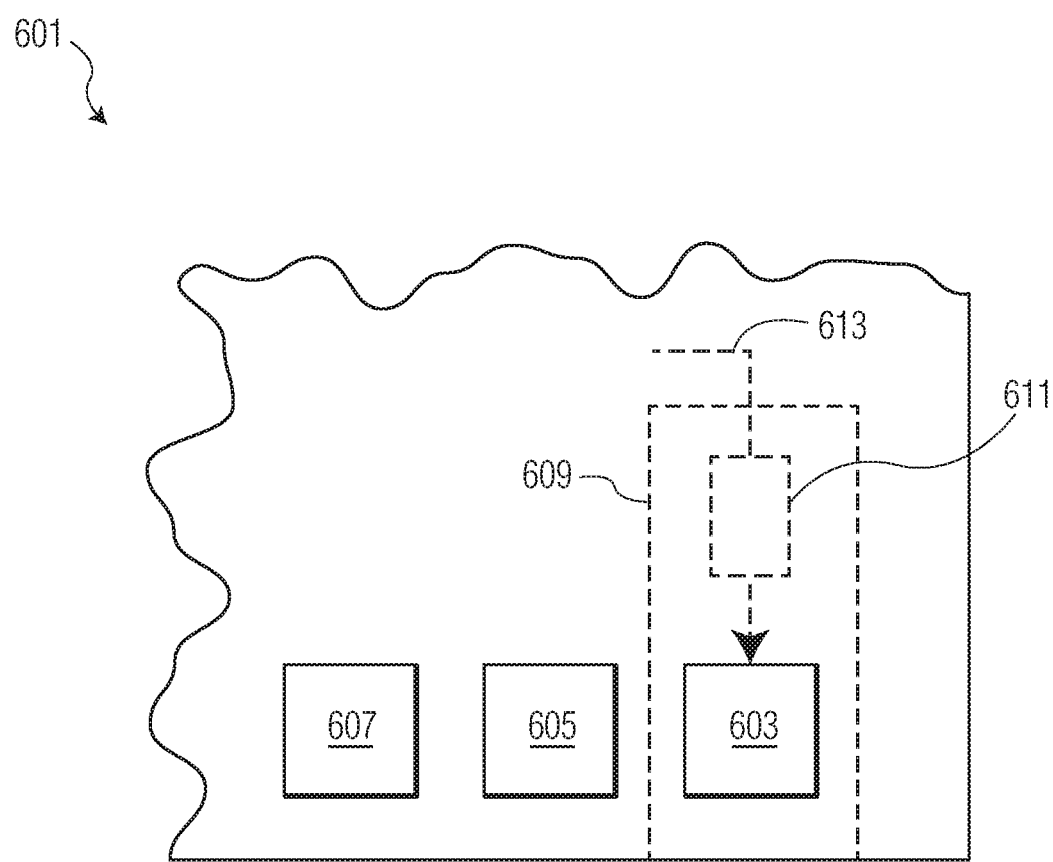
FIG. 6 is a partial top view of an integrated circuit according to one embodiment of the present invention.

FIG. 6 is a partial top view of an integrated circuit according to one embodiment of the present invention. Integrated circuit 601 includes a number of pads (with pads 603, 605, and 607 shown in FIG. 1) for receiving and providing signals to external electronic components (not shown). The pads may also receive power supply voltages from external power supplies. In the embodiment shown, each I/O pad (603) is associated with an I/O cell (609) that includes semiconductor devices (e.g. transistors) in the integrated circuit to form I/O circuitry for the pad. In the embodiment shown, I/O cell 609 includes an A/D converter 611 similar to A/D converter 101 where pad 603 is connected to the input (103) of converter 611. A/D converter 611 includes an output 613 for providing a digital representation of the voltage applied to pad 603 that can be used by processing circuitry (not shown) of integrated circuit 601. In other embodiments, an integrated circuit may include other A/D converters located in other I/O cells or at other locations in the integrated circuit. Also in other embodiments, an integrated circuit may have other types of external terminals for I/O signals and power such as conductive bumps or conductive posts.

As described above, providing an A/D converter having bin comparators whose outputs enable other bin comparators of the converter may provide for a converter that requires less transistors in the encoding circuitry and/or in producing a remainder voltage for subsequent stages in some embodiments. Also, in some embodiments, disabling some of the bin comparators with the outputs of other bin comparators may provide for reduced power consumption in the A/D conversion process.

In other embodiments, A/D converters may have other configurations, include other circuitry, and/or operate in other ways. For example, in some embodiments, a stage may include a 4 to 2 encoder wherein the fourth signal (not shown) indicating that the voltage of input 103 is less than ¼ HV is produced by a logical NOR of S1, S2, and S3. In still other embodiments, register 113 may produce a parallel digital output. In still other embodiments, input 103 may be coupled to other nodes of an integrated circuit including to internal nodes of the integrated circuit.

In other embodiments, the outputs of the lower threshold voltage bin comparators would enable or disable the higher threshold voltage bin comparators.

In one such example of an embodiment, the inverting inputs of the bin comparators (e.g. 119, 121, and 125) of a stage would be coupled to the input (103) and the non-inverting inputs of the bin comparators would be coupled to the various threshold voltages (which is the opposite comparator configuration of stage 105 shown in FIG. 1). A "1" generated by a bin comparator would indicate that the input voltage is less than the threshold voltage. Thus, a 1 produced by a lower threshold voltage comparator would disable the higher threshold voltage comparators from providing comparison results. Accordingly, with such an embodiment, only the comparator receiving the lowest threshold voltage that is higher than the input voltage would produce a 1. If none of the comparators produce a 1, then the input voltage is higher than ¾ HV. The truth table (118) of the encoder of the stage would be adjusted accordingly.

In still other embodiments, a converter would include a greater number of stages. In some embodiments, an additional bin level selector and subtractor would be used to subtract the selected threshold voltage from a previous stage from a remainder voltage of the previous stage.

In one embodiment, an analog-to-digital converter (A/DC) is configured to receive an analog voltage and provide a digital output which corresponds to a digital representation of the analog voltage. The A/DC includes N bin comparators, wherein N is an integer greater than one. Each bin comparator of the N bin comparators is coupled to receive the analog voltage and a corresponding bin threshold voltage and configured to provide an output signal for providing a corresponding comparison result between the analog voltage and the corresponding bin threshold voltage such that the N bin comparators provide N output signals. Each bin comparator of N−1 bin comparators of the N bin comparators includes an enable input configured to selectively enable the output signal of the bin comparator to provide the corresponding comparison result based on a corresponding comparison result from at least one other bin comparator of the N bin comparators. The A/DC includes an encoder circuit coupled to receive the N output signals from the N bin comparators and configured to encode the N output signals to form at least one more significant bit of the digital output. The A/DC includes a bin selection circuit configured to select a voltage level based on the N output signals and provide the selected voltage level to a next stage of the A/DC. The next stage of the A/DC is configured to use the selected voltage level and the analog voltage to provide at least one less significant bit of the digital output wherein the at least one less significant bit is less significant than the at least one more significant bit.

In another embodiment, an analog-to-digital (A/DC) converter is configured to receive an analog voltage and provide a digital output which corresponds to a digital representation of the analog voltage. The A/DC includes a first bin comparator coupled to receive the analog voltage and a first bin threshold voltage and configured to provide a first output signal for providing a first comparison result between the analog voltage and the first bin threshold voltage. The A/DC includes a second bin comparator coupled to receive the analog voltage and a second bin threshold voltage and configured to provide a second output signal for providing a second comparison result between the analog voltage and the second bin threshold voltage. The second output signal is configured to be selectively enabled to provide the second comparison result based at least on the first output signal. The A/DC includes a third bin comparator coupled to receive the analog voltage and a third bin threshold voltage and configured to provide a third output signal for providing a third comparison result between the analog voltage and the third bin threshold voltage. The third output signal is configured to be selectively enabled to provide the third comparison result based on at least on the second output signal and the first output signal. The A/DC includes an encoder circuit coupled to receive the first, second, and third output signals and configured to use the first, second, and third output signals to form at least one more significant bit of the digital output. The A/DC includes a bin selection circuit configured to select a voltage level based on the first, second, and third output signals and provide the selected voltage level to a next stage of the A/DC. The next stage of the A/DC is configured to use the selected voltage level and the analog voltage to provide at least one lesser significant bit of the digital output, the at least one lessor significant bit is of less significance than the at least on more significant bit.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An analog-to-digital converter (A/DC) configured to receive an analog voltage and provide a digital output which corresponds to a digital representation of the analog voltage, the A/DC comprising:
   N bin comparators, wherein N is an integer greater than one, wherein each bin comparator of the N bin comparators is coupled to receive the analog voltage and a corresponding bin threshold voltage and configured to provide an output signal for providing a corresponding comparison result between the analog voltage and the corresponding bin threshold voltage such that the N bin comparators provide N output signals, and wherein each bin comparator of N−1 bin comparators of the N bin comparators includes:
      an enable input configured to selectively enable the output signal of the bin comparator to provide the corresponding comparison result based on a corresponding comparison result from at least one other bin comparator of the N bin comparators;
   an encoder circuit coupled to receive the N output signals from the N bin comparators and configured to encode the N output signals to form at least one more significant bit of the digital output; and
   a bin selection circuit configured to select a voltage level based on the N output signals and provide the selected voltage level to a next stage of the A/DC, wherein the next stage of the A/DC is configured to use the selected voltage level and the analog voltage to provide at least one less significant bit of the digital output wherein the at least one less significant bit is less significant than the at least one more significant bit.

2. The A/DC of claim 1, wherein the enable input of at least one of the N−1 bin comparators is configured to selectively enable the output signal of at least one of the N−1 bin comparators to provide the corresponding comparison result based on an output signal from at least two other bin comparators of the N bin comparators.

3. The A/DC of claim 1, wherein the N output signals are provided directly to the bin selection circuit.

4. The A/DC of claim 1, wherein a first comparator of the N bin comparators, which is not in the N−1 bin comparators, includes an enable input which is coupled to receive a global A/DC enable signal to selectively enable the output signal of the first comparator to provide the corresponding comparison result.

5. The A/DC of claim 1, wherein the next stage of the A/DC comprises:
   a subtractor having a first input coupled to the analog voltage and a second input coupled to receive the selected voltage level from the bin selection circuit, wherein the subtractor is configured to provide a remainder voltage corresponding to a difference between the analog voltage and the selected voltage level.

6. The A/DC of claim 5, wherein the next stage of the A/DC further comprises:
   M bin comparators, wherein M is an integer greater than one, wherein each bin comparator of the M bin comparators is coupled to receive the remainder voltage and a corresponding remainder bin threshold voltage and configured to provide an output signal for providing a corresponding remainder comparison result between the remainder voltage and the corresponding remainder bin threshold voltage such that the M bin comparators provide M output signals, and wherein each bin comparator of M−1 bin comparators of the M bin comparators includes:
      an enable input configured to selectively enable the output signal of the bin comparator to provide the comparison result based on a corresponding comparison result from at least one other bin comparator of the M bin comparators; and
   a second encoder circuit coupled to receive the M output signals from the M bin comparators and configured to encode the M output signals to form the at least one less significant bit of the digital output.

7. The A/DC of claim 6, wherein N is equal to M.

8. The A/DC of claim 6, wherein the corresponding bin threshold voltages are sequentially increasing or decreasing in value by a first fixed voltage amount, the corresponding remainder bin threshold voltages are sequentially increasing or decreasing in value by a second fixed voltage amount, and a greatest corresponding reminder bin threshold voltage is less than the first fixed voltage amount.

9. The A/DC of claim 6, wherein a first comparator of the N bin comparators, which is not in the N−1 bin comparators, the subtractor, and a first comparator of the M bin comparators, which is not in the M−1 bin comparators, each includes an enable input which is coupled to receive a global A/DC enable signal.

10. The A/DC of claim 1, wherein the corresponding bin threshold voltages are sequentially increasing or decreasing in value by a fixed voltage amount.

11. The A/DC of claim 1 wherein the analog voltage is a voltage of an integrated circuit external terminal.

12. The A/DC of claim 1 wherein the N bin comparators includes:
   a first bin comparator coupled to receive the analog voltage and a first bin threshold voltage and configured to provide a first output signal for providing a first comparison result between the analog voltage and the first bin threshold voltage;
   a second bin comparator coupled to receive the analog voltage and a second bin threshold voltage and configured to provide a second output signal for providing a second comparison result between the analog voltage and the second bin threshold voltage, wherein the second output signal is configured to be selectively enabled to provide the second comparison result based at least on the first output signal;
   a third bin comparator coupled to receive the analog voltage and a third bin threshold voltage and configured to provide a third output signal for providing a third comparison result between the analog voltage and the third bin threshold voltage, wherein the third output signal is configured to be selectively enabled to provide the third comparison result based on at least on the second output signal and the first output signal.

13. An analog-to-digital (A/DC) converter configured to receive an analog voltage and provide a digital output which corresponds to a digital representation of the analog voltage, the A/DC comprising:
   a first bin comparator coupled to receive the analog voltage and a first bin threshold voltage and configured to provide a first output signal for providing a first comparison result between the analog voltage and the first bin threshold voltage;
   a second bin comparator coupled to receive the analog voltage and a second bin threshold voltage and configured to provide a second output signal for providing a second comparison result between the analog voltage and the second bin threshold voltage, wherein the second output signal is configured to be selectively enabled to provide the second comparison result based at least on the first output signal;
   a third bin comparator coupled to receive the analog voltage and a third bin threshold voltage and configured to provide a third output signal for providing a third comparison result between the analog voltage and the third bin threshold voltage, wherein the third output signal is configured to be selectively enabled to provide the third comparison result based on at least on the second output signal and the first output signal;
   an encoder circuit coupled to receive the first, second, and third output signals and configured to use the first, second, and third output signals to form at least one more significant bit of the digital output; and
   a bin selection circuit configured to select a voltage level based on the first, second, and third output signals and provide the selected voltage level to a next stage of the A/DC, wherein the next stage of the A/DC is configured to use the selected voltage level and the analog voltage to provide at least one lesser significant bit of the digital output, the at least one lessor significant bit is of less significance than the at least on more significant bit.

14. The A/DC of claim 13, wherein the first output signal is configured to be selectively enabled to provide the first comparison result based on a global A/DC enable signal.

15. The A/DC of claim 13, wherein the first, second, and third output signals are provided directly to the bin selection circuit.

16. The A/DC of claim 13, wherein the third output signal is configured to be selectively enabled to provide the third comparison result based on a logical combination of the first output signal and the second output signal.

17. The A/DC of claim 13, wherein the selected voltage level corresponds to at least the first bin threshold voltage, the second bin threshold voltage, the third bin threshold voltage, or a power supply voltage.

18. The A/DC of claim 13, wherein the next stage of the A/DC comprises:
   a subtractor having a first input coupled to the analog voltage and a second input coupled to receive the selected voltage level from the bin selection circuit, wherein the subtractor is configured to provide a remainder voltage corresponding to a difference between the analog voltage and the selected voltage level.

19. The A/DC of claim 18, wherein the next stage of the A/DC further comprises:
   a fourth bin comparator coupled to receive the remainder voltage and a fourth bin threshold voltage and configured to provide a fourth output signal for providing a fourth comparison result between the remainder voltage and the fourth bin threshold voltage;
   a fifth bin comparator coupled to receive the remainder voltage and a fifth bin threshold voltage and configured to provide a fifth output signal for providing a fifth comparison result between the remainder voltage and the fifth bin threshold voltage, wherein the fifth output signal is configured to be selectively enabled to provide the fifth comparison result based at least on the fourth output signal;
   a sixth bin comparator coupled to receive the remainder voltage and a sixth bin threshold voltage and configured to provide a sixth output signal for providing a sixth comparison result between the remainder voltage and the sixth bin threshold voltage, wherein the sixth output signal is configured to be selectively enabled to provide the sixth comparison result based on at least on the fifth output signal and the fourth output signal;
   a second encoder circuit coupled to receive the fourth, fifth, and sixth output signals and configured to encode the fourth, fifth, and sixth output signals to form the at least one lessor significant bit of the digital output.

20. The A/DC of claim 19, wherein the first, second, and third bin threshold voltages are sequentially increasing or decreasing in value by a first fixed voltage amount, and the fourth, fifth, and sixth bin threshold voltages are sequentially increasing or decreasing in value by a second fixed voltage amount, and a greatest value of the fourth, fifth, and sixth bin threshold voltages is less than the first fixed voltage amount.

* * * * *